United States Patent [19]

Koyama

[11] Patent Number: 5,023,491
[45] Date of Patent: Jun. 11, 1991

[54] FILTER CIRCUIT ARRANGEMENTS WITH AUTOMATIC ADJUSTMENT OF CUT-OFF FREQUENCIES

[75] Inventor: Jun Koyama, Tokyo, Japan

[73] Assignee: NEC Corporation, Japan

[21] Appl. No.: 297,426

[22] Filed: Jan. 17, 1989

[30] Foreign Application Priority Data

Jan. 18, 1988 [JP] Japan ................................. 63-8940
Jan. 18, 1988 [JP] Japan ................................. 63-8941

[51] Int. Cl.⁵ .......................... H03K 5/00; H03K 3/20
[52] U.S. Cl. .................................... 307/521; 328/167; 328/155
[58] Field of Search ............... 307/520, 521; 328/162, 328/165, 167, 149; 364/724.19, 724.01, 825

[56] References Cited

U.S. PATENT DOCUMENTS

| | | | |
|---|---|---|---|
| 3,761,741 | 9/1973 | Hozft | 307/567 |
| 3,946,249 | 3/1976 | Nagami et al. | 307/521 |
| 4,257,018 | 3/1981 | Masdea et al. | 328/167 |
| 4,322,641 | 3/1982 | Packard | 307/521 |
| 4,667,120 | 5/1987 | Okada et al. | 328/167 |
| 4,782,246 | 11/1988 | Kuroyanagi et al. | 328/155 |
| 4,818,903 | 4/1989 | Kawano | 307/521 |
| 4,841,461 | 6/1989 | Yamamoto et al. | 328/167 |

Primary Examiner—Timothy P. Callahan
Attorney, Agent, or Firm—Laff, Whitesel, Conte & Saret

[57] ABSTRACT

For automatically controlling cut-off frequencies of filter units, a filter circuit comprises a controller having an oscillator producing a first output signal, a sample filter unit supplied with the first output signal and producing a second output signal, a status signal producing circuit responsive to the second output signal and producing a status signal representative of a deviation of the second output signal from a standard state, and a comparator operative to compare the status signal with a standard signal for producing said control signal.

8 Claims, 5 Drawing Sheets

PRIOR-ART

PRIOR-ART

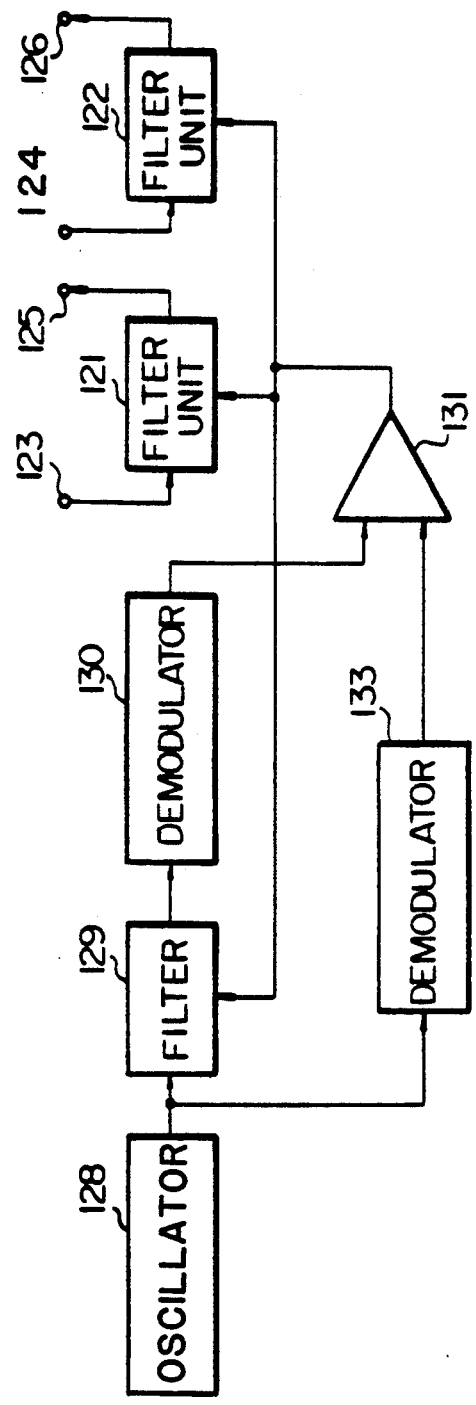

FILTER CIRCUIT ARRANGEMENTS WITH AUTOMATIC ADJUSTMENT OF CUT-OFF FREQUENCIES

FIELD OF THE INVENTION

This invention relates to a filter circuit and, more particularly, to a controller automatically adjusting cut-off frequencies of filter units incorporated therein.

BACKGROUND OF THE INVENTION

A typical example of the filter circuit is illustrated in FIG. 1 and largely comprises two filter units 1 and 2 which have input nodes 3 and 4, output nodes 5 and 6 and control nodes 7 and 8, respectively. Both of the filter units 1 and 2 are of the voltage control type and, accordingly, responsive to the voltage levels at the respective control nodes for changing the cut-off frequencies. For this purpose, the filter units 1 and 2 are associated with a controller 9 which varies a control signal in voltage level on the basis of the adjustment of a variable resistor 10 coupled between the controller and a ground terminal. In detail, the circuit arrangement of the prior-art filter circuit is illustrated in FIG. 2 and implemented by a combination of n-p-n type bipolar transistors, p-n-p type bipolar transistors, capacitors and resistors. As shown in FIG. 2 of the drawings, the input node 3 is coupled to the base node of an n-p-n type bipolar transistor 11, and the output node 5 is coupled to the base node of an n-p-n type bipolar transistor 12. Two p-n-p type bipolar transistors 13 and 14 are coupled in parallel between a positive voltage source Vcc and the n-p-n type bipolar transistors 11 and 12, and the base nodes of the p-n-p type bipolar transistors 13 and 14 are commonly coupled to the collector node of the p-n-p type bipolar transistor 13. A series combination of an n-p-n type bipolar transistor 15 and a resistor 16 is coupled between the emitter nodes of the n-p-n type bipolar transistors 11 and 12 and the ground terminal. A series combination of an n-p-n type bipolar transistor 17 and a resistor 18 is coupled between the positive voltage source Vcc and the ground terminal, and the output node 5 is provided between the n-p-n type bipolar transistor 17 and the resistor 18. A capacitor 19 is coupled at one electrode thereof to the ground terminal, and the other electrode of the capacitor 19 is shared by the collector node of the p-n-p type bipolar transistor 14 and the base node of the n-p-n type bipolar transistor 17. The filter unit 1 thus arranged is similar in circuit arrangement to the filter unit 2, and, for this reason, component elements of the filter unit 2 corresponding to the component elements 11 to 19 are designated by reference numerals 21 to 29, respectively. The controller 9 is implemented by a series combination of a resistor 31 and the variable resistor 10 coupled between the positive voltage source Vcc and the ground terminal, and an output node 32 of the controller 9 is provided between the resistor 31 and the variable resistor 32 and coupled to the base electrodes of the n-p-n type bipolar transistors 15 and 25 for the sake of the variation of the cut-off frequencies.

Description is made for the adjustment of the cut-off frequencies. The cut-off frequency $f_{L(1)}$ of the filter unit 4 is calculated as follows:

$$f_{L(1)} = g_m / (2 \times \pi \times C_{19}) \qquad (Eq. 1)$$

where $C_{19}$ is the capacitance of the capacitor 19 and the mutual conductance $g_m$ is given by Equation 2.

$$g_m = (q \times I_0)/(2 \times k \times T) = 1/r_e \qquad (Eq. 2)$$

where q is the elementary charge of about $1.62 \times 10^{-19}$ (C), k is the Boltzmann constant of about $1.38 \times 10^{-23}$ (W×S/°k), T is a temperature in Kelvin scale, and $I_0$ is given by Equation 3.

$$I_0 = [\{R10/(R31+R10)\} \times V_{cc} - V_{BE(Q15)}] \times (1/R16) \qquad (Eq. 3)$$

where R10, R31 and R16 are respective resistances of the resistors 10, 31 and 16, Vcc is the difference in voltage level between the positive voltage source Vcc and the ground terminal, and $V_{BE(Q15)}$ is the emitter-base voltage of the n-p-n type bipolar transistor 15. As understood from the above equations, the filter unit 1 is varied in cut-off frequency by changing the mutual conductance $g_m$ which in turn is adjusted by manually changing the resistance R10 of the variable resistor 10.

The filter unit 2 is adjusted to have a different cut-off frequency with the capacitor 29 and the resistor different in capacitance or resistance from the capacitor 19 and the resistor 16, and the cut-off frequency is calculated in the similar manner for the filter unit 2.

A problem is encountered in the prior-art filter circuit in operability due to the variable resistor 10 manually changed in resistance.

SUMMARY OF THE INVENTION

It is therefore an important object of the present invention to provide a filter circuit which is improved in operability.

It is also an important object of the present invention to provide a filter circuit which is automatically adjustable in cut-off frequency.

To accomplish these object of the present invention, the present invention proposes to provide a sample filter circuit in the controller for detecting a deviation of operational environment.

In accordance with the present invention, there is provided a filter circuit comprising a) a plurality of filter units responsive to a control signal for changing cut-off frequencies, respectively; and b) a controller having an oscillator producing a first output signal, a sample filter unit supplied with the first output signal and producing a second output signal, status signal producing means responsive to the second output signal and producing a status signal representative of a deviation of the second output signal from a standard state, and a comparator operative to compare the status signal with a standard signal for producing the control signal.

BRIEF DESCRIPTION OF THE DRAWINGS

The features and advantages of a filter circuit according to the present invention will be more clearly understood from the following description taken in conjunction with the accompanying drawings in which:

FIG. 6 is a block diagram showing the arrangement of still another filter circuit embodying the present invention.

DESCRIPTION OF THE PREFERRED EMBODIMENTS

First embodiment

Figure 1:
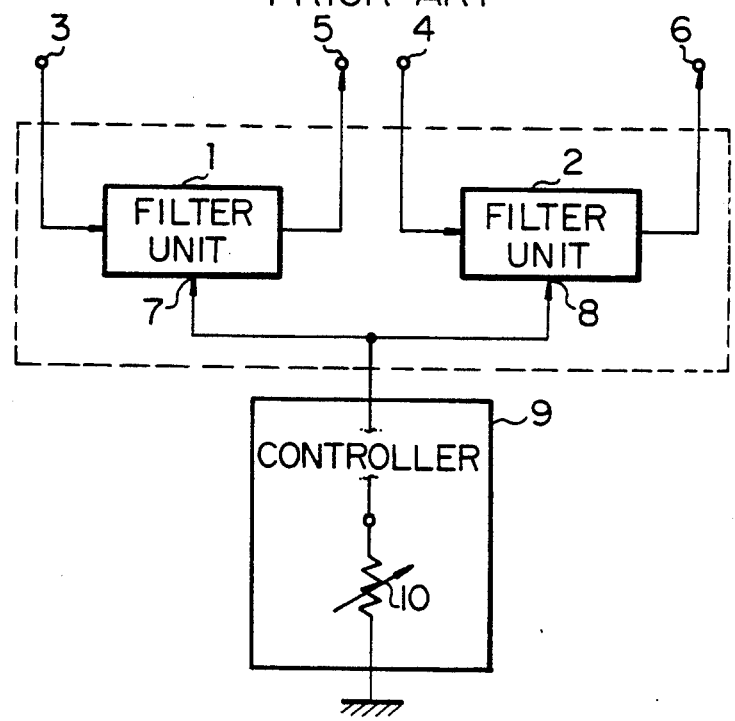
FIG. 1 is a block diagram showing the arrangement of a prior-art filter circuit.
Figure 2:
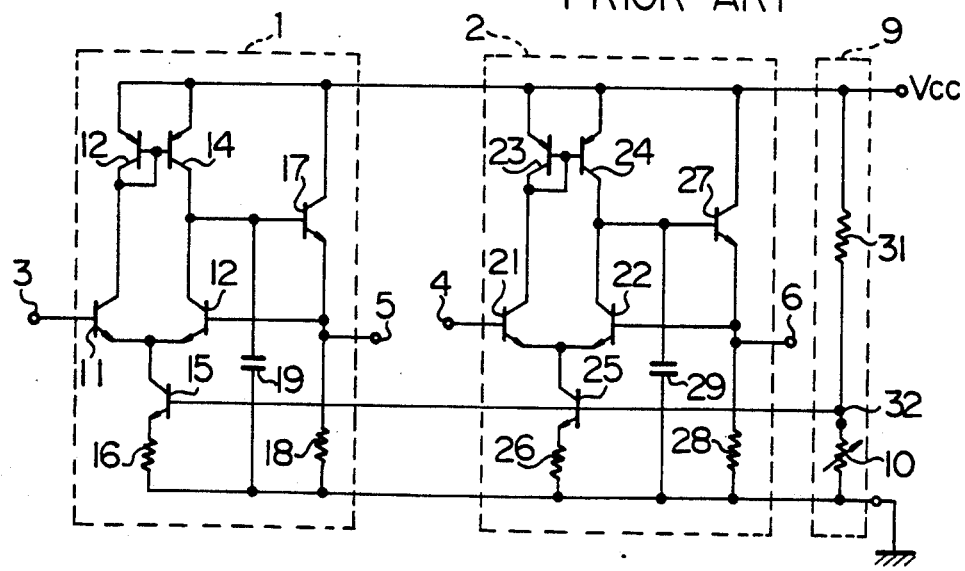
FIG. 2 is a diagram showing the circuit arrangement of the prior-art filter circuit shown in FIG. 1.
Figure 3:
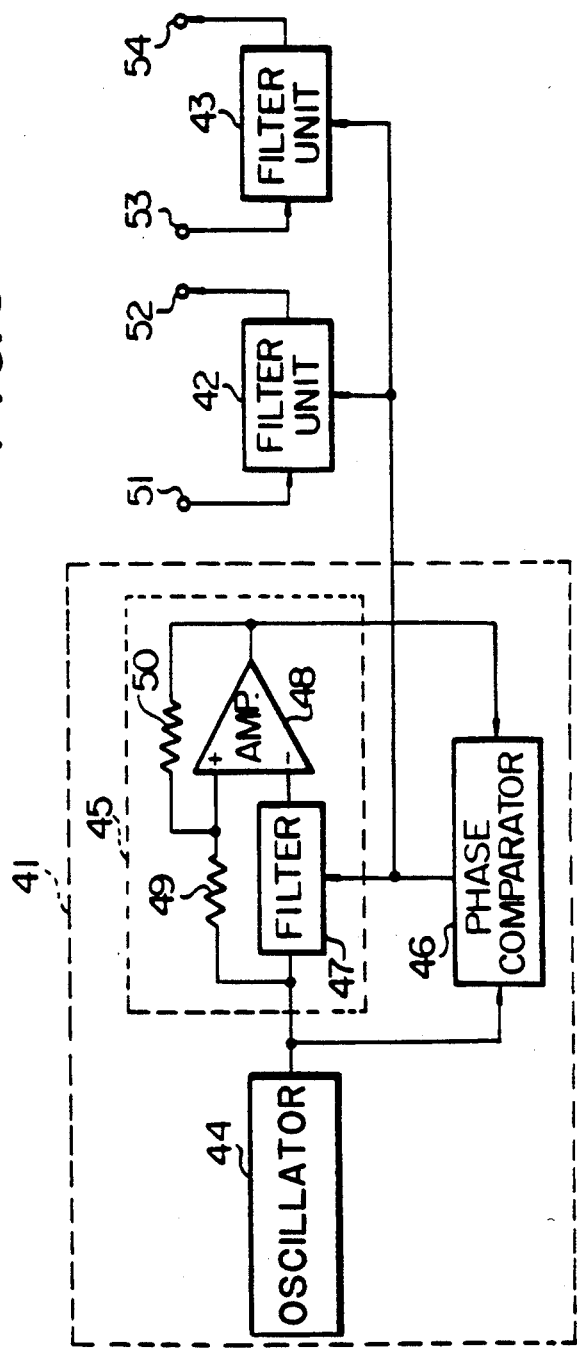
FIG. 3 is a block diagram showing the arrangement of a filter circuit embodying the present invention.

Referring first to FIG. 3 of the drawings, there is shown the circuit arrangement of a filter circuit embodiment of the present invention. The filter circuit shown in FIG. 3 has a controller 41 provided in association with a plurality of filter units including two filter units 42 and 43, and the controller 41 largely comprises an oscillator 44, a phase shifter 45 and a phase comparator 46. The phase shifter 45 has a filter 47, an amplifier 48 and resistors 49 and 50. The filter 49 and the resistor 49 are coupled in parallel between the oscillator 44 and the inverted node and the non-inverted node of the amplifier 48, and the resistor 50 interconnects the non-inverted node and the output node of the amplifier 48. An input node 51 and an output node 52 are provided in association with the filter unit 42, and the filter unit 43 is accompanied with an input node 53 and an output node 54.

When an output signal with a certain frequency is supplied in parallel from the oscillator 44 to the filter 47 and the resistor 49, the phase shifter 45 produces an output signal different in phase from the output signal of the oscillator 44 by about 90 degrees. The output signal of the amplifier 48 is supplied to the phase comparator 46 and compared with the output signal of the oscillator 44 to produce a control signal which is supplied to not only the filter 47 for maintaining the difference in phase but also the filter units 42 and 43 for adjusting the cut-off frequencies. The phase shifter 41 has the filter 47, and, for this reason, the output signal of the phase shifter reflects the operational environment of the filter 47.

Figure 4:
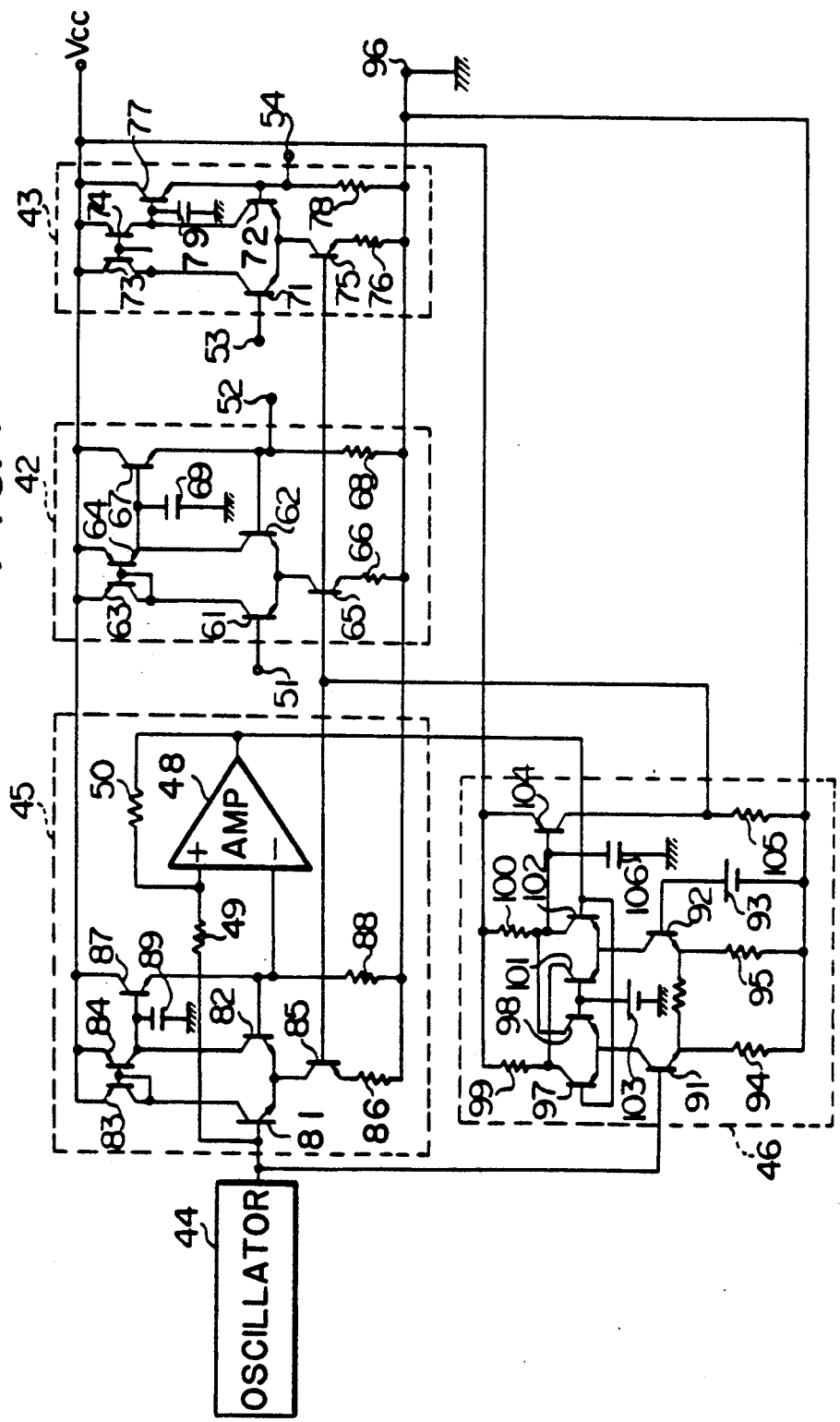
FIG. 4 is a diagram showing the circuit arrangement of the filter circuit shown in FIG. 3.

The circuit behavior is described in detail with reference to FIG. 4 of the drawings. The filter units 42 and 43 and the filter 47 are similar in circuit arrangement to the filter unit 1, and, for this reason, reference numerals 61 to 69 designate component elements of the filter unit 42 corresponding to the component elements 11 to 19. Similarly, reference numerals 71 to 79 are used for designation of component elements of the filter unit 43 corresponding to the elements 11 to 19, and component elements of the filter 47 corresponding to the elements 11 to 19 are designated by reference numerals 81 to 89. Even though the circuit arrangements are similar to one another, the corresponding capacitors and the corresponding resistors are not identical in capacitance and resistance. Namely, the respective cut-off frequencies of the filters 42, 43 and 47 are adjustable by selecting the resistances of the resistors 66, 76 and 86 or, alternatively, the capacitances of the capacitors 69, 79 and 89.

The phase comparator 46 comprises an n-p-n type bipolar transistor the base node of which is coupled to the oscillator 44. An n-p-n type bipolar transistor 92 has the base node coupled to a positive biasing voltage source 93, and resistors 94 and 95 are coupled in parallel between the n-p-n type bipolar transistors 91 and 92 and a ground terminal 96. Two n-p-n type bipolar transistors 97 and 98 are coupled in parallel between resistors 99 and 100 and the n-p-n type bipolar transistor 91, and two n-p-n type bipolar transistors 101 and 102 are also coupled in parallel between the resistors 99 and 100 and the n-p-n type bipolar transistor 92. The output signal of the amplifier 48 is supplied to the base electrodes of the n-p-n type bipolar transistors 97 and 102, and a positive biasing voltage source 103 is coupled to the base nodes of the n-p-n type bipolar transistors 98 and 101. A series combination of a p-n-p type bipolar transistor 104 and a resistor 105 is coupled between the positive voltage source Vcc and the ground terminal 96 for serving as an output driver, and a capacitor 106 is coupled to the base node of the p-n-p type bipolar transistor 104.

Phase characteristics Ph(omega) of the phase shifter 45 are represented by Equation 4:

$$Ph(omega) = 2\ tan^{-1}\ (omega)/(omega_a) \qquad \text{(Eq. 4)}$$

where $(omega_a)$ is the cut-off frequency defined by the mutual conductance $g_m$ of the differential amplifier formed by the n-p-n type bipolar transistors 81 and 82 and the capacitance C106 of the capacitor 106. The cut-off frequency $(omega_a)$ is given by Equation 5:

$$(omega_a) = g_m/C106 \qquad \text{(Eq. 5)}$$

The output signal is supplied from the oscillator 44 to the phase shifter 45 to produce the output signal different in phase from the output signal of the oscillator 44 by about 90 degrees which in turn is supplied to the base nodes of the n-p-n type bipolar transistors 97 and 102. The output signal of the oscillator 44 is further supplied to the base node of the n-p-n type bipolar transistor 91, then the output signals are compared in phase with each other for producing the control signal representative of the difference therebetween. The control signal is subjected to a smoothing by the capacitor 106 and, then, provided to the n-p-n type bipolar transistors 85, 65 and 75 for adjusting the mutual conductances of the respective filters 47, 42 and 43. If the mutual conductance are thus adjusted, the phase shifter 45 causes the output signal thereof to be different in phase from the output signal of the oscillator 44 by about 90 degrees, and the filter units 42 and 43 adjust the respective cut-off frequencies $f_{L(42)}$ and $f_{L(43)}$ as follows.

$$f_{L(42)} = g_m/(2 \times \pi \times C69) \qquad \text{(Eq. 6)}$$

$$f_{L(43)} = g_m/(2 \times \pi \times C79) \qquad \text{(Eq. 7)}$$

where C69 an C79 are respective capacitances of the capacitors 69 and 79.

As described hereinbefore, the cut-off frequencies are adjustable by selecting the capacitances of the capacitors 69, 79 and 89 or the resistances of the resistors 66, 76 and 86. Then, if a ratio is provided for the resistances of the resistors 66, 76 and 86 or the capacitances of the capacitors 69, 79 and 89, arbitrary filtering characteristics are achieved by the filter circuit illustrated in FIGS. 3 and 4.

As will be understood from the foregoing description, the cut-off frequencies are automatically adjusted by the control signal produced in the self-control loop formed in the controller 41.

Second embodiment

Figure 5:
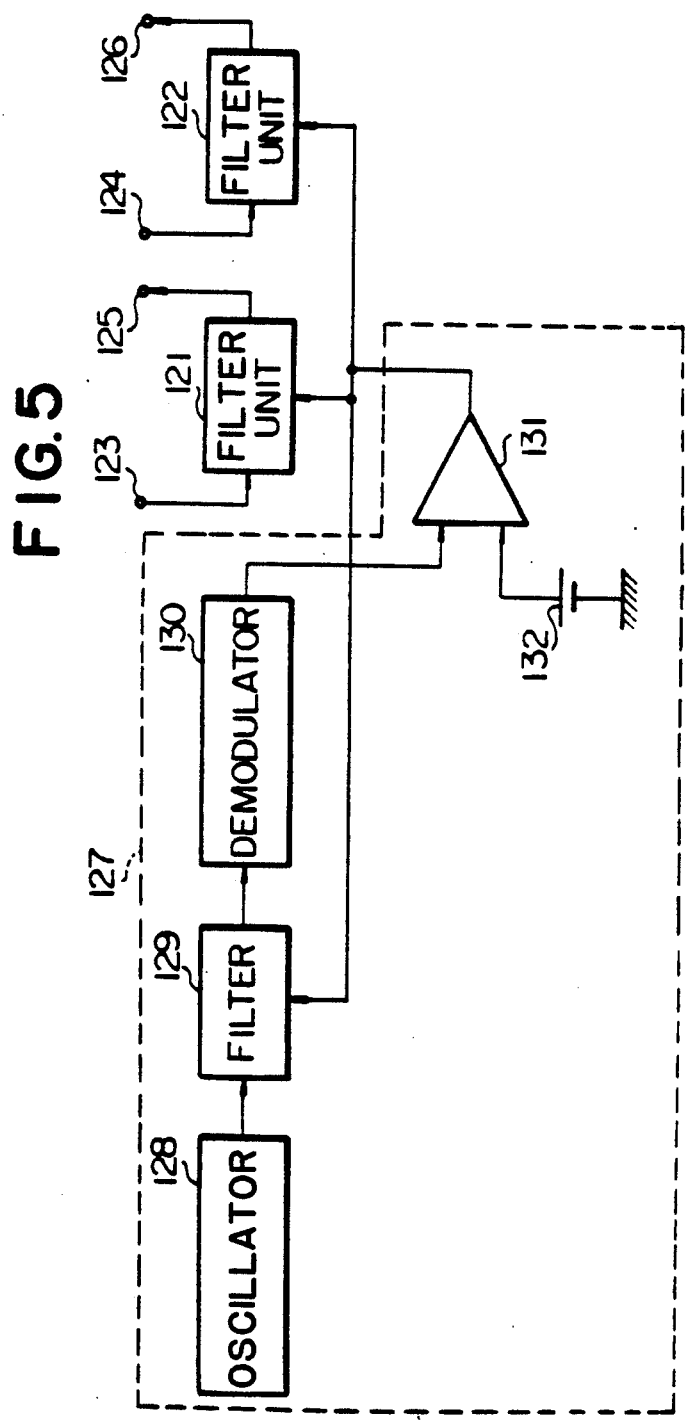
FIG. 5 is a block diagram showing the arrangement of another filter circuit embodying the present invention.

Turning to FIG. 5 of the drawings, there is shown another filter circuit embodying the present invention. The filter circuit shown in FIG. 5 largely comprises two filter units 121 and 122 accompanied with respective input nodes 123 and 124 and respective output nodes 125 and 126, and a controller 127. The filter unit 121 and 122 are similar in circuit arrangement to the filter unit 42, and, for this reason, no further description is incorporated.

The controller 127 comprises an oscillator 128 producing a first output signal with a certain frequency f0, a filter 129 supplied with the first output signal and producing a second output signal, a demodulator or a frequency-detector 130 supplied with the second output signal and producing a voltage signal, and a voltage comparator 131 operative to compare the voltage signal with a reference voltage level from a battery 132. Then, the voltage comparator produces a control signal representative of a difference in voltage level between the voltage signal and the reference voltage level. The filter 129 is similar in circuit arrangement to the filter unit 121 or 122, and all of the filters 121, 122 and 129 are of the voltage control type. In this instance, the filter 129 is of the low pass filter and has a cut-off frequency f129 which is selected to be lower than the certain frequency f0.

In operation, the first output signal with the certain frequency f0 is supplied to the low pass filter 129 and is decreased in frequency by the function of the low pass filter 129 in accordance with the frequency characteristics thereof. In this instance, the attenuation ratio is about −6 dB/oct. The second output signal thus attenuated in frequency is supplied to the demodulator for converting into the voltage signal corresponding to the frequency of the second output signal. Then, the voltage signal is representative of the operational environment of the low pass filter 129, and, accordingly, the control signal produced by the voltage comparator is indicative of a deviation of the second output signal or the operational environment from the standard state represented by the reference voltage level. The control signal is fed back to not only the cut-off frequency controlling node of the filter 129 but also the cut-off frequency controlling nodes of the filter units 121 and 122. As a result, the filter units 121 and 122 are automatically adjusted in cut-off frequency, thereby being improved in operability.

The filter circuit described hereinbefore is of the voltage control type, however, it is easy to implement a filter circuit of the current control type on the basis of the circuit arrangement shown in FIG. 5.

Third embodiment

Turning to FIG. 6 of the drawing, there is shown the arrangement of still another filter circuit embodying the present invention. The filter circuit shown in FIG. 6 is similar in circuit arrangement to the filter circuit shown in FIG. 5 except for the battery 132 replaced with a demodulation circuit 133. Then, the reference voltage level is supplied from the demodulator 133 to the voltage comparator 131, and the reference voltage level is produced on the basis of the first output signal of the oscillator 128. The circuit behavior is similar to that of the filter circuit shown in FIG. 5 except for the production of the reference voltage level, and, for this reason, no further description is incorporated.

Although particular embodiments of the present invention have been shown and described, it will be obvious to those skilled in the art that various changes and modifications may be made without departing from the spirit and scope of the present invention.

What is claimed is:

1. A filter circuit comprising
(a) a plurality of filter units responsive to a control signal for changing cut-off frequencies, respectively; and
(b) a controller having an oscillator for producing a first output signal, a sample filter unit supplied with the first output signal and producing a second output signal, status signal producing means responsive to the second output signal and producing a status signal which is representative of a deviation in phase of the second output signal from a standard signal corresponding to said first output signal, and a comparator operative to compare the status signal with said standard signal for producing said control signal, in which said status signal producing means is formed by an amplifier coupled at an inverted node thereof to said sample filter unit, a first resistor coupled between said oscillator and a non-inverted node of the amplifier, and a second resistor coupled between the non-inverted node and an output node of the amplifier, said sample filter circuit, said first and second resistors and said amplifier circuit forming in combination a phase shifter.

2. A filter circuit as set forth in claim 1, in which said status signal producing means is formed by an amplifier coupled at an inverted node thereof to said sample filter unit, a first resistor coupled between said oscillator and a non-inverted node of the amplifier, and a second resistor coupled between the non-inverted node and an output node of the amplifier, said sample filter circuit, said first and second resistors and said amplifier circuit forming in combination a phase shifter.

3. A filter circuit as set forth in claim 2, in which said first output signal serves as said standard signal and in which said comparator is responsive to a difference in phase between the first output signal and the status signal.

4. A filter circuit comprising
(a) a plurality of filter units responsive to a control signal for changing cut-off frequencies, respectively; and
(b) a controller having an oscillator for producing a first output signal, a sample filter unit supplied with the first output signal and producing a second output signal, status signal producing means responsive to the second output signal and producing a status signal which is representative of a deviation in phase of the second output signal from a standard signal corresponding to said first output signal, and a comparator operative to compare the status signal with said standard signal for producing said control signal, in which said status signal producing means is formed by a demodulator producing the status signal varied in voltage level depending upon the frequency of said second output signal.

5. A filter circuit as set forth in claim 4, in which said sample filter is of the low pass filter having a cut-off frequency selected to be lower than the frequency of said first output signal.

6. A filter circuit as set forth in claim 5, in which said controller further comprises a battery producing said standard signal with a certain voltage level.

7. A filter circuit as set forth in claim 5, in which said controller further comprises a demodulator supplied with the first output signal and producing said standard signal with a certain voltage level.

8. A filter circuit comprising
   (a) a plurality of filter units each having a cut-off frequency controlling node;
   (b) an oscillator having an output node where a first output signal with a certain frequency is supplied;
   (c) a demodulator having an input node coupled to the output node of said oscillator through one of said filter units and an output node;
   (d) a biasing voltage source; and
   (e) a voltage comparator having an output node coupled to the cut-off frequency controlling node of each filter unit and two input nodes one of which is coupled to the output node of the demodulator and the other of which is coupled to said biasing voltage source.

* * * * *